(12) United States Patent
Han et al.

(10) Patent No.: US 10,943,799 B2
(45) Date of Patent: Mar. 9, 2021

(54) NOZZLE FOR CLEANING SUBSTRATE

(71) Applicant: HS HI-TECH CO., LTD., Hwaseong (KR)

(72) Inventors: Man Ho Han, Ansan (KR); Young Min Ju, Siheung (KR); Guk Ki Ahn, Seoul (KR); Yun Deok Kim, Daejeon (KR)

(73) Assignee: HS HI-TECH CO., LTD., Hwaseong (KR)

( * ) Notice: Subject to any disclaimer, the term of this patent is extended or adjusted under 35 U.S.C. 154(b) by 121 days.

(21) Appl. No.: 16/198,390

(22) Filed: Nov. 21, 2018

(65) Prior Publication Data

US 2019/0164788 A1   May 30, 2019

(30) Foreign Application Priority Data

Nov. 30, 2017   (KR) .................. 10-2017-0163667

(51) Int. Cl.
| | |
|---|---|
| *B08B 3/02* | (2006.01) |
| *H01L 21/67* | (2006.01) |
| *B29C 65/08* | (2006.01) |
| *B29C 65/00* | (2006.01) |
| *B05B 1/18* | (2006.01) |
| *B29L 31/00* | (2006.01) |

(52) U.S. Cl.
CPC ........ *H01L 21/67051* (2013.01); *B05B 1/185* (2013.01); *B08B 3/02* (2013.01); *B29C 65/08* (2013.01); *B29C 66/30321* (2013.01); *B29C 66/30325* (2013.01); *B29C 66/5324* (2013.01); *B29L 2031/772* (2013.01)

(58) Field of Classification Search
CPC ..... H01L 21/67051; B05B 1/185; B08B 3/02; B29C 65/08; B29C 66/30321; B29C 66/30325; B29C 66/5324; B29L 2031/772

USPC ....................................................... 134/198
See application file for complete search history.

(56) References Cited

U.S. PATENT DOCUMENTS

2012/0293588 A1*  11/2012  Shimamura .......... B41J 2/17553
                                                       347/84

FOREIGN PATENT DOCUMENTS

| CN | 105848786 A | 8/2016 |
| KR | 1020100101452 A | 9/2010 |
| KR | 1020170034135 A | 3/2017 |

OTHER PUBLICATIONS

KR20170034135A—Machine translation (Year: 2017).*

* cited by examiner

*Primary Examiner* — Tinsae B Ayalew (57) ABSTRACT

The present invention relates to a nozzle for cleaning a substrate capable of spraying deionized water for cleaning a substrate to the substrate, the nozzle including a first body made of a resin material and provided with a first part of a deionized water passage and a deionized water supply hole to supply the deionized water, a second body made of a resin material and provided with a second part of the deionized water passage and a plurality of spray holes to spray the deionized water to the substrate, a fusible protrusion provided in the first body or the second body along the deionized water passage and configured such that a part thereof is fused during ultrasonic welding, so as to couple the first body and the second body together, and a fusible protrusion accommodating part formed in the first body or the second body to accommodate the fusible protrusion.

11 Claims, 9 Drawing Sheets

blank …

NOZZLE FOR CLEANING SUBSTRATE

CROSS REFERENCE TO RELATED APPLICATION

The present application claims priority to Korean Patent Application No. 10-2017-0163667, filed Nov. 30, 2017, the entire contents of which is incorporated herein for all purposes by this reference.

BACKGROUND OF THE INVENTION

Field of the Invention

The present invention relates generally to a nozzle for cleaning a substrate. More particularly, the present invention relates to a nozzle for cleaning a substrate, the nozzle being capable of spraying deionized water for cleaning a substrate to the substrate.

Description of the Related Art

A substrate processing apparatus for processing an object to be processed such as a semiconductor wafer or a flat panel display substrate can be classified into an etching device, a cleaning device, a stripper, a developer, and the like. The cleaning device of the substrate processing apparatus is a device for removing impurities such as particles remaining on a surface of a substrate by performing a specific process.

Generally, a nozzle for cleaning a substrate provided in the cleaning device can remove impurities such as particles from the substrate and clean the same by spraying deionized water to the substrate surface. The nozzle for cleaning a substrate may be configured such that a linear deionized water passage of single body is used through machining, or may be configured such that an upper body and a lower body are separately fabricated and a deionized water passage is formed, and then the upper body and the lower body are coupled into a single body by a third material such as an adhesive or by physical fastening using a screw or the like.

The foregoing is intended merely to aid in the understanding of the background of the present invention, and is not intended to mean that the present invention falls within the purview of the related art that is already known to those skilled in the art.

SUMMARY OF THE INVENTION

However, the conventional nozzle for cleaning a substrate is problematic in that when high pressure deionized water flows into the linear deionized water passage in the single body, state deformation may occur at the deionized water inlet or outlet of the nozzle for cleaning a substrate, and due to the limitation of machining, it is difficult to realize complex and various shapes of the deionized water passage inside the nozzle. Further, when the upper body and the lower body are separately manufactured, it is easy to form complex and various shapes of the deionized water passage, but the manufacturing process is complicated and the bonding surface between the upper body and the lower body may be corroded by the adhesive which adheres to the upper body and the lower body, and corrosion of the adhesive may occur due to chemicals used in the cleaning process of the substrate. This corrosion can cause the adhesive strength to be reduced and the nozzle for cleaning a substrate to be easily broken, which leads to a decrease in strength due to the continuous load on the body of the nozzle for cleaning a substrate. In addition, a portion of the corroded adhesive may be separated and clog spray holes, or may be sprayed together with deionized water when spraying the deionized water to damage the substrate.

Accordingly, the present invention has been made keeping in mind the above problems occurring in the related art, and an object of the present invention is to provide a nozzle for cleaning a substrate, in which when the nozzle is separately formed into an upper body and a lower body, each of the bodies is formed of a resin material of engineering plastics having high strength used as an industrial material and a structural material, whereby it is possible to easily form complex and various shapes of deionized water passage by machining or injection molding. Further, without using bonding by a third material such as an adhesive or using physical fastening by a screw, by using the resin material, it is possible to couple the upper body and the lower body together simply and firmly by ultrasonic welding. However, these objectives are illustrative, and thus the scope of the present invention is not limited thereby.

In order to accomplish the above object, according to an aspect of the present invention, there is provided a nozzle for cleaning a substrate, the nozzle including: a first body made of a resin material, and configured such that a first surface thereof is provided with a first part of a deionized water passage through which deionized water for cleaning a substrate flows and a deionized water supply hole is formed through from a second surface thereof to the deionized water passage of the first surface so as to supply the deionized water; a second body made of a resin material, and configured such that a first surface thereof coupled to the first body is provided with a second part of the deionized water passage and a plurality of spray holes are formed through from the deionized water passage to a deionized water spray surface along the deionized water passage so as to spray the deionized water to the substrate; a fusible protrusion provided protruding from the first body or the second body along the deionized water passage, and configured such that a part thereof is fused during ultrasonic welding, so as to couple the first body and the second body together by ultrasonic welding; and a fusible protrusion accommodating part formed in the first body or the second body along the deionized water passage in a shape corresponding to the fusible protrusion to accommodate the fusible protrusion.

In the nozzle for cleaning a substrate, the fusible protrusion may include: a first fusible step formed in an entirely circular shape or a partial arc shape having a first diameter along the deionized water passage based on a central axis of the first body or the second body; and a second fusible step formed in an entirely circular shape or a partial arc shape having a second diameter larger than the first diameter to surround the first fusible step, and the fusible protrusion accommodating part may include: a first fusible linear groove part formed in the first body or the second body along the deionized water passage in a shape corresponding to the first fusible step to accommodate the first fusible step; and a second fusible linear groove part formed in the first body or the second body along the deionized water passage in a shape corresponding to the second fusible step to accommodate the second fusible step.

The nozzle for cleaning a substrate may further include a fusible ridge provided protruding along the fusible protrusion or the fusible protrusion accommodating part and fused during ultrasonic welding by being brought into contact with a bottom surface of the fusible protrusion accommodating part or a protruding surface of the fusible protrusion.

The nozzle for cleaning a substrate may further include a fusible ridge accommodating part concavely formed along the fusible protrusion accommodating part or the fusible protrusion to accommodate a part of the fusible ridge, thereby receiving melt generated when the fusible ridge is melted during ultrasonic welding.

In the nozzle for cleaning a substrate, the fusible ridge may be formed in a wave form along the fusible protrusion or the fusible protrusion accommodating part.

In the nozzle for cleaning a substrate, the fusible protrusion may be configured such that a first protruding corner is protrudingly formed on an inner diameter side thereof and a second protruding corner is protrudingly formed on an outer diameter side thereof with a quadrangular cross-section, and the fusible protrusion accommodating part may be configured such that a first accommodating corner is concavely formed on an inner diameter side thereof and a second accommodating corner is concavely formed on an outer diameter side thereof with a quadrangular cross-section to correspond the fusible protrusion.

In the nozzle for cleaning a substrate, the first accommodating corner may be formed with a first inclined portion inclined at a first angle with respect to a bottom surface of the fusible protrusion accommodating part such that the first protruding corner is sequentially brought into contact therewith and is melted during ultrasonic welding, and the second accommodating corner may be formed with a second inclined portion inclined at a second angle with respect to the bottom surface of the fusible protrusion accommodating part such that the second protruding corner is sequentially brought into contact therewith and is melted during ultrasonic welding.

In the nozzle for cleaning a substrate, the fusible protrusion accommodating part may be configured such that the first angle of the first inclined portion and the second angle of the second inclined portion are different from each other to be asymmetrically melted during ultrasonic welding and to allow the melt to be filled from the first accommodating corner or the second accommodating corner.

In the nozzle for cleaning a substrate, the fusible protrusion may be provided with a third inclined portion formed in the first protruding corner or the second protruding corner by being inclined with respect to the protruding surface of the fusible protrusion to be asymmetrically melted during ultrasonic welding and to allow the melt to be filled from the first accommodating corner or the second accommodating corner, and the fusible protrusion accommodating part may be protrudingly provided with a quadrangular protruding portion with a quadrangular cross-section in the first protruding corner or the second protruding corner, to be sequentially brought into contact with the third inclined portion and be melted.

In the nozzle for cleaning a substrate, the fusible protrusion may be configured such that the first protruding corner is formed to have a first height from a surface of the first body, and the second protruding corner is formed to have a second height, which is different from the first height, from a surface of the first body, whereby the protruding surface is formed to be inclined, so as to be asymmetrically melted during ultrasonic welding and to allow the melt to be filled from the first accommodating corner or the second accommodating corner.

In the nozzle for cleaning a substrate, the fusible protrusion accommodating part may be configured such that the first accommodating corner is formed to have a first depth from a surface of the second body, and the second accommodating corner is formed to have a second depth, which is different from the first depth, from a surface of the second body, whereby the bottom surface is formed to be inclined, so as to be asymmetrically melted during ultrasonic welding and to allow the melt to be filled from the first accommodating corner or the second accommodating corner.

In the nozzle for cleaning a substrate, the resin material may be engineering plastics of a material selected from the group consisting of PEEK, POK, PPS, PCTFE, and PFA.

According to the nozzle for cleaning a substrate according to an embodiment of the present invention configured as described above, when the nozzle is separately formed into an upper body and a lower body, each of the bodies is formed of a resin material of strong engineering plastics used as an industrial material and a structural material, whereby it is possible to easily form complex and various shapes of deionized water passage by machining or injection molding. Further, without using bonding by a third material such as an adhesive or using physical fastening by a screw, by using the resin material, it is possible to couple the upper body and the lower body together simply and firmly by ultrasonic welding.

Accordingly, deionized water can easily be accommodated in the nozzle by forming complex and various shapes of deionized water passage in the body having high strength, and thereby, when the ultrasonic vibration is generated by a vibration device provided on the upper body, deionized water in the deionized water passage is sprayed onto the substrate in the form of fine droplets through the spray holes of the lower body to effectively clean the micropattern of the substrate.

Further, the nozzle for cleaning a substrate is advantageous in that without using a third material such as an adhesive, the upper and lower bodies of resin material are firmly coupled together only by a simple process using ultrasonic welding, whereby the manufacturing cost is reduced and the strength of the body is increased, so as to easily clean the substrate in various pressure ranges. Of course, the scope of the present invention is not limited by these effects.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Hereinbelow, exemplary embodiments of the present invention will be described in detail with reference to the accompanying drawings.

It should be understood that the embodiments of the present invention may be changed to a variety of embodiments and the scope and spirit of the present invention are not limited to the embodiments described hereinbelow. The embodiments of the present invention described hereinbelow are provided for allowing those skilled in the art to more clearly comprehend the present invention. Therefore, it should be understood that the shape and size of the elements shown in the drawings may be exaggeratedly drawn to provide an easily understood description of the structure of the present invention.

Hereinafter, embodiments of the present invention will be described with reference to drawings schematically illustrating ideal embodiments of the present invention. In the drawings, for example, variations in the shape shown may be expected, depending on the manufacturing technique and/or tolerance. Accordingly, the embodiments of the present invention should not be construed as being limited to the particular shapes of the regions shown herein, but should include, for example, variations in shape resulting from manufacturing.

Figure 1:
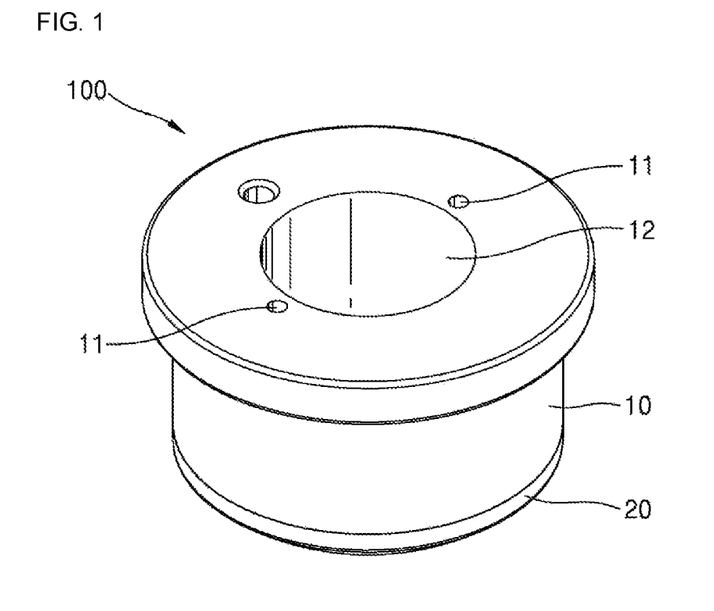
FIG. 1 shows a perspective view of a nozzle for cleaning a substrate according to an embodiment of the present invention.
Figure 2:
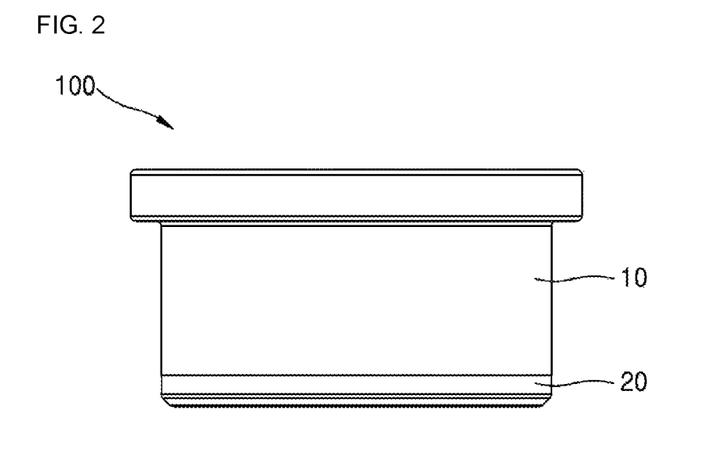
FIG. 2 schematically shows a sectional view of the nozzle for cleaning a substrate of FIG. 1.
Figure 3:
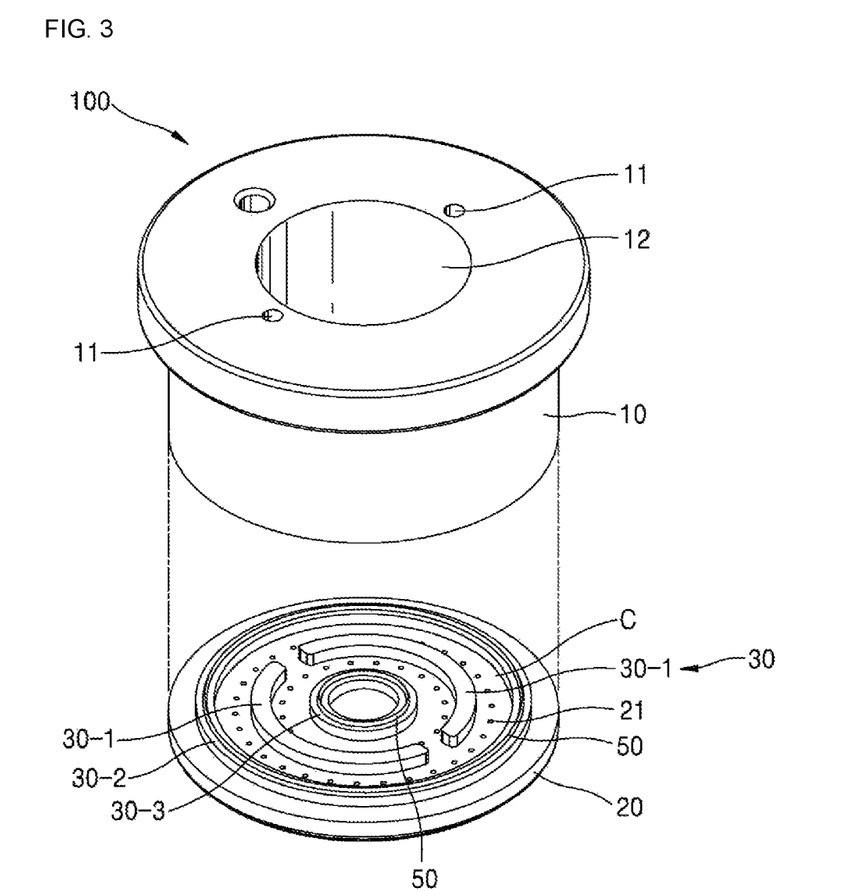
FIGS. 3 and 4 schematically show exploded perspective views of the nozzle for cleaning a substrate of FIG. 1.
Figure 4:
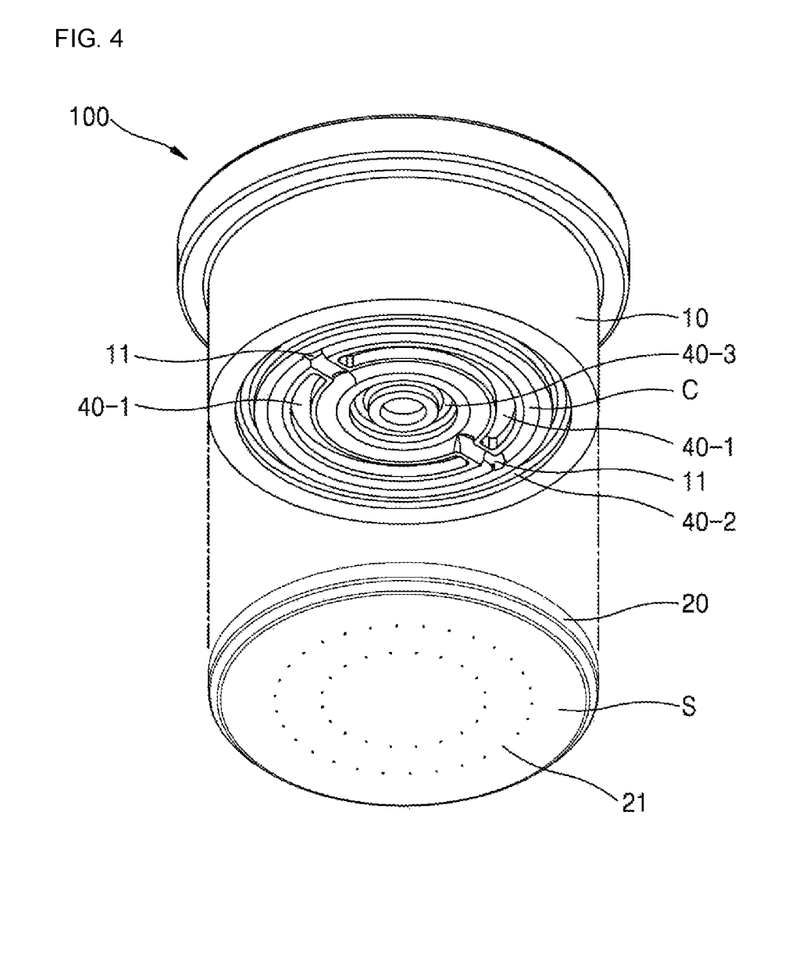
Figure 5A:
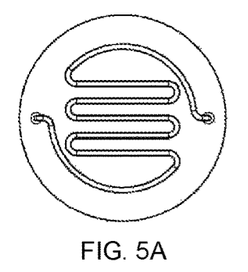
FIGS. 5A to 5K schematically show sectional views of various embodiments of a deionized water passage of the nozzle for cleaning a substrate of FIG. 1.
Figure 5B:
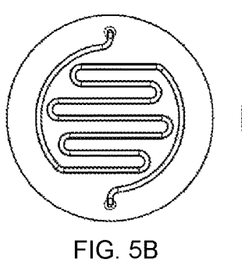
Figure 5C:
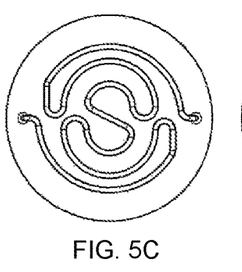
Figure 5D:
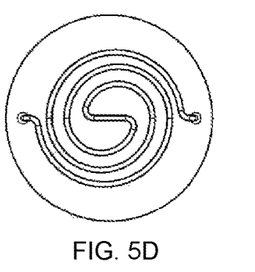
Figure 5E:
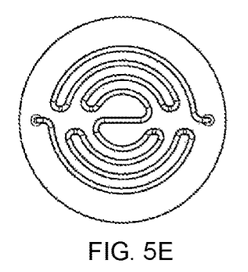
Figure 5F:
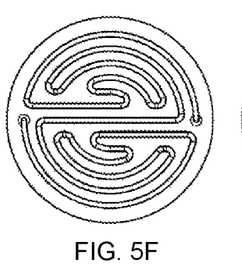
Figure 5G:
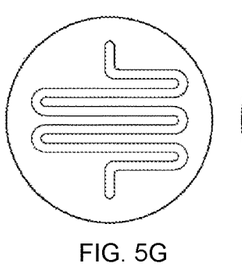
Figure 5H:
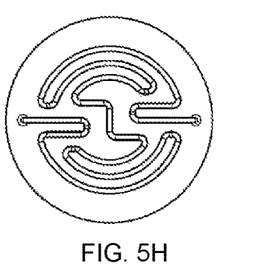
Figure 5I:
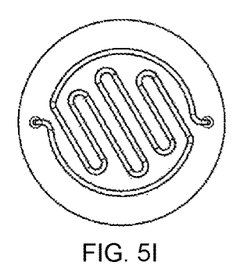
Figure 5J:
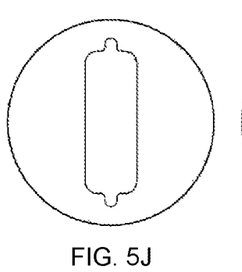
Figure 5K:
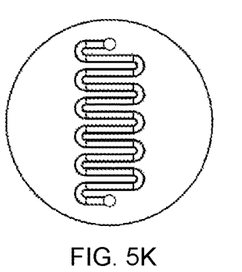

FIG. 1 shows a perspective view of a nozzle 100 for cleaning a substrate according to an embodiment of the present invention; FIG. 2 schematically shows a sectional view of the nozzle 100 for cleaning a substrate of FIG. 1; FIGS. 3 and 4 schematically show exploded perspective views of the nozzle 100 for cleaning a substrate of FIG. 1.

Firstly, as shown in FIGS. 1 to 4, the nozzle 100 for cleaning a substrate according to an embodiment of the present invention may roughly include a first body 10, a second body 20, a fusible protrusion 30, and a fusible protrusion accommodating part 40.

As shown in FIG. 3, the first body 10 is made of a resin material in a cylindrical shape, and may be configured such that a first surface thereof is provided with a first part of a deionized water passage C through which deionized water for cleaning a substrate flows, and a deionized water supply hole 11 is formed through from a second surface thereof to the deionized water passage C of the first surface so as to supply the deionized water.

Further, as shown in FIG. 4, the second body 20 is made of a resin material in a cylindrical shape to correspond to the first body 10, and may be configured such that a first surface thereof coupled to the first body 10 is provided with a second part of the deionized water passage C, and a plurality of spray holes 21 are formed through from the deionized water passage C to a deionized water spray surface S along the deionized water passage C so as to spray the deionized water to the substrate. In addition, the shape of the first body 10 and the second body 20 is not limited to those shown in FIGS. 3 and 4, but may be formed in various shapes such as a rectangular shape or a polygonal shape.

Further, the first body 10 may be formed with a vibrator receiving groove 12 on the central axis to correspond to the shape of the vibrator so as to accommodate the vibrator. To be more specific, a piezoelectric element as the vibrator is mounted to the vibrator receiving groove 12, such that according to the vibration generated by the piezoelectric element, the high pressure deionized water flowing through the deionized water passage C is sprayed to the substrate through the spray holes 21.

Further, the deionized water passage C is configured such that the first part thereof is provided in the first surface of the first body 10, and the second part thereof is provided in the first surface of the second body 20, but considering the type of deionized water and the discharge volume and pressure through the spray holes 21, the deionized water passage may be either the first surface of the first body 10 or the first surface of the second body 20.

To be more specific, a width of the lower portion of the deionized water passage C may be formed to be equal to or smaller than that of the upper portion thereof and the cross section of the deionized water passage C may be formed into any one of a rectangular shape, a trapezoid shape, and a semicircular shape. It is preferable that in order to converge the deionized water towards the spray holes 21, the deionized water passage is formed in a trapezoidal shape with a lower width smaller than the upper width. In addition, regardless of shape, such as a circular shape, a polygonal shape such as a triangular and a rectangular shape, various shapes that can easily converge the deionized water toward the spray holes 21 may be applied. Further, the shape of the deionized water passage C is not limited to those shown in FIGS. 3 and 4, but may be formed in various shapes shown in FIGS. 5A to 5K.

Further, the spray holes 21 may be formed in a shape that vertically penetrates the second body 20 by radiating laser light along the second part of the deionized water passage C formed in the second body 20. Here, a plurality of spray holes 21 may be formed spaced apart from each other at predetermined intervals along the second part of the deionized water passage C. For example, the spray holes 21 are formed to have a cross section of minute circular shape and are arranged at predetermined intervals, but not limited thereto, may be formed in various shapes to spray the deionized water to the substrate, considering the type of deionized water, the discharge volume and pressure through the spray holes 21, and the shape of the deionized water passage C.

Further, the deionized water spray surface S of the second body 20 may be hydrophilized so that the deionized water sprayed through the spray holes 21 can be sprayed smoothly onto the substrate without forming on the deionized water spray surface S. To be more specific, since the deionized water spray surface S is hydrophilized to prevent the deionized water from forming onto the deionized water spray surface S, the deionized water is sprayed onto the substrate while being maintained at uniform size and constant velocity through the spray holes 21, whereby it is possible to effectively clean the substrate while minimizing damage to the micropattern formed on the substrate.

Further, it may be most preferable that the resin material be engineering plastics of polyetheretherketone (PEEK) so that the first body 10 and the second body 20 can be easily coupled by ultrasonic welding. In addition, a variety of engineering plastics such as POK, PPS, PCTFE and PFA may be used, and the first body 10 and the second body 20 may be made of the same material or different materials in the engineering plastic series.

To be more specific, the ultrasonic welding of the first body 10 and the second body 20 may be performed in such a way that after the electric energy is converted into the mechanical vibration energy through the vibrator, the first body 10 and the second body 20 are laminated and pressed, whereby a strong frictional heat is generated instantaneously on the bonding surfaces between the first body 10 and the second body 20, and the bonding surfaces are melted and adhered to form a strong molecular bond.

Therefore, the first body 10 and the second body 20 are formed of the resin material and can be bonded by ultrasonic welding, and thus, no separate adhesive is required when the first body 10 and the second body 20 are bonded, and the bonding state may be very strong through the strong molecular bond. Further, since the ultrasonic welding is performed within 0.1 to 1 second, and the process time is very short, it is advantageous for mass production, and boding process can be performed without deforming or altering the surface of the product. In addition, the ultrasonic welding is semi-permanent by using semiconductor material, i.e. resin material, with less etching effect than glass materials such as quartz, and consumes less power, so it can reduce a defective product rate and reduce process cost.

Here, to bond the first body 10 and the second body 20 by ultrasonic welding, the fusible protrusion 30 is provided in the first body 10 or the second body 20 protruding along the deionized water passage C such that a part thereof is fused during ultrasonic welding, and the fusible protrusion accommodating part 40 is provided in the first body 10 or the second body 20 along the deionized water passage C in a shape corresponding to the fusible protrusion 30 to accommodate the fusible protrusion 30, whereby it is possible to make the ultrasonic welding easy and firm.

To be more specific, the fusible protrusion 30 may include: a first fusible step 30-1 formed in an entirely circular shape or a partial arc shape having a first diameter along the deionized water passage C based on a central axis of the first body 10 or the second body 20; and a second fusible step 30-2 formed in an entirely circular shape or a partial arc shape having a second diameter larger than the first diameter to surround the first fusible step 30-1.

Further, the fusible protrusion accommodating part 40 may include: a first fusible linear groove part 40-1 formed in the first body 10 or the second body 20 along the deionized water passage C in a shape corresponding to the first fusible step 30-1 to accommodate the first fusible step 30-1; and a second fusible linear groove part 40-2 formed in the first body 10 or the second body 20 along the deionized water passage C in a shape corresponding to the second fusible step 30-2 to accommodate the second fusible step 30-2.

Here, depending on the required bonding strength of the ultrasonic welding, a third fusible step 30-3 and a third fusible linear groove part 40-3 having a shape corresponding to the third fusible step may be further provided. However, not limited thereto, depending on the required bond strength of the first body 10 and the second body 20, the thickness of the second body 20, the number of spray holes 21, and the arrangement of the spray holes 21, the fusible step and the linear groove part may be arranged in various shapes and may be provided in various numbers.

According to the nozzle 100 for cleaning a substrate according to the embodiment of the present invention, when the nozzle 100 for cleaning a substrate is separately formed into the first body 10 and the second body 20, each of the bodies 10 and 20 is formed of a resin material of engineering plastics having high strength used as an industrial material and a structural material, whereby it is possible to easily form complex and various shapes of deionized water passage C by machining or injection molding. Further, without using bonding by a third material such as an adhesive or using physical fastening by a screw, by using the resin material, it is possible to couple the first body and the second body 20 together simply and firmly by ultrasonic welding.

Accordingly, deionized water can easily be accommodated in the nozzle by forming complex and various shapes of deionized water passage C in the bodies 10 and 20 having high strength, and thereby, when the ultrasonic vibration is generated by a vibrator provided in the first body 10, deionized water in the deionized water passage C is sprayed onto the substrate in the form of fine droplets through the spray holes 21 of the second body 20 to effectively clean the substrate while minimizing damage to the micropattern thereof.

Further, without using a third material such as an adhesive, the first body 10 and the second body 20 of resin material are firmly coupled together only by a simple process using ultrasonic welding, whereby the manufacturing cost is reduced and the strength of the bodies 10 and 20 is increased, so as to easily clean the substrate in various pressure ranges.

Figure 6:
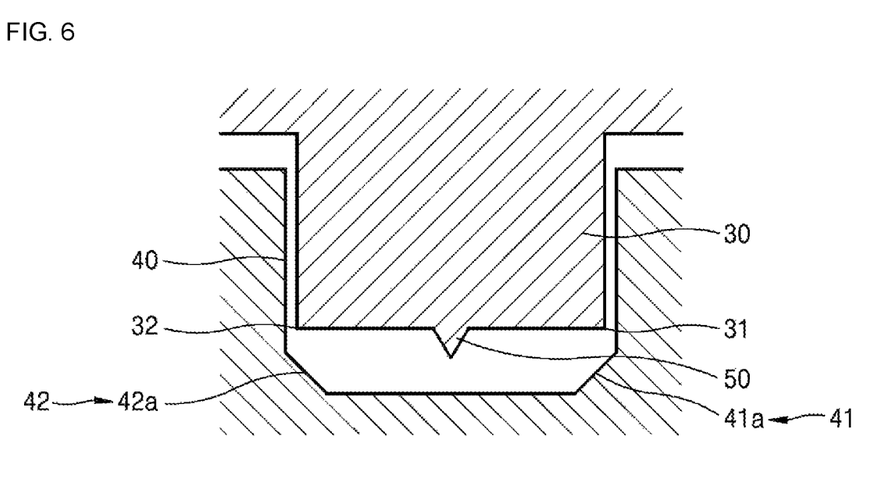
FIGS. 6 and 7 schematically show sectional views of various embodiments of a fusible protrusion and a fusible protrusion accommodating part of the nozzle for cleaning a substrate of FIG. 1.
Figure 7:
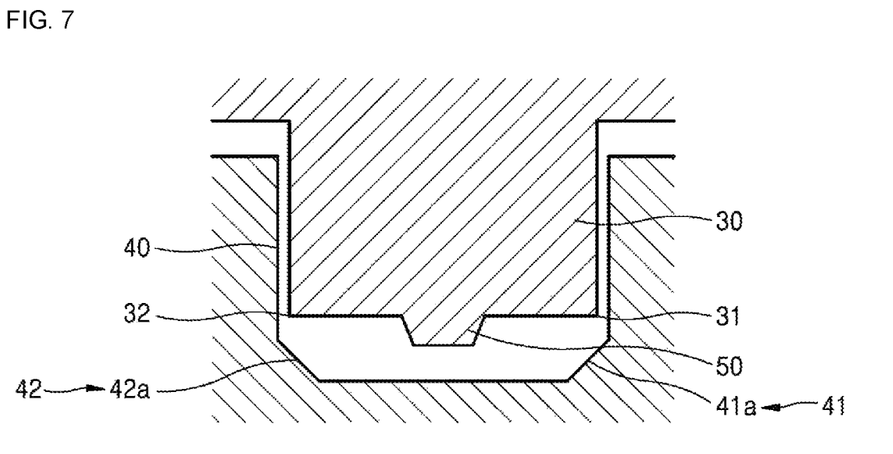
Figure 8:
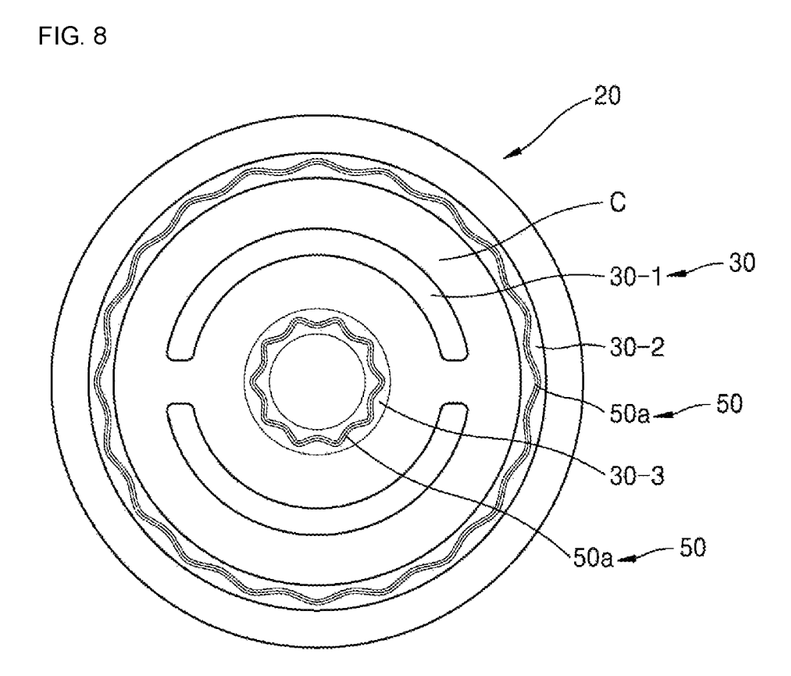
FIG. 8 schematically shows a sectional view of another embodiment of a fusible ridge of the fusible protrusion of FIG. 6.

FIGS. 6 and 7 schematically show sectional views of various embodiments of the fusible protrusion 30 and the fusible protrusion accommodating part 40 of the nozzle 100 for cleaning a substrate of FIG. 1; FIG. 8 schematically shows a sectional view of another embodiment of a fusible ridge 50 of the fusible protrusion 30 of FIG. 6; and FIGS. 9 to 14 schematically show sectional views of further various embodiments of the fusible protrusion 30 and the fusible protrusion accommodating part 40 of the nozzle 100 for cleaning a substrate of FIG. 1.

As shown in FIG. 6, the nozzle 100 for cleaning a substrate may further include a fusible ridge 50 provided protruding along the fusible protrusion 30 or the fusible protrusion accommodating part 40 and fused during ultrasonic welding by being brought into contact with a bottom surface of the fusible protrusion accommodating part 40 or a protruding surface of the fusible protrusion 30.

To be more specific, to prevent a void from forming at a certain portion when the melt of the fusible protrusion 30 is not smoothly filled in a space below the fusible protrusion 30 during ultrasonic welding, the fusible ridge 50 may be provided in the fusible protrusion 30 at a position corresponding to the area where the void usually forms.

Here, the fusible ridge 50, as shown in FIGS. 6 and 7, may have a triangular or trapezoidal cross-section of various sizes depending on the required bond strength, and may be formed into an entirely arc shape along the trajectory of the fusible protrusion 30. Further, as shown in FIG. 8, the fusible ridge 50 is formed in a wave form along the fusible protrusion 30 or the fusible protrusion accommodating part 40 to widen the contact and friction area of the fusible ridge 50 during ultrasonic welding, it is possible to induce the melt to be more easily filled in the area where the void forms. In addition, regardless of the shapes of the deionized water passage C and the nozzle 100 for cleaning a substrate, the fusible ridge 50 may be formed in a shape having a variety of cross-sections and trajectories in which ultrasonic welding is facilitated.

Accordingly, during ultrasonic welding, the fusible ridge 50 is brought into contact with the bottom surface of the fusible protrusion accommodating part 40 and is melted before the fusible protrusion 30, whereby it is possible to control the flow of the melt to be filled from the area where the void usually forms. Thereby, the melt of the fusible protrusion 30 and the fusible ridge 50 is induced to be evenly filled to the bonding surface without void formation during ultrasonic welding, and thus, it is possible to make ultrasonic welding even easier and increase bonding force even further.

Figure 9:
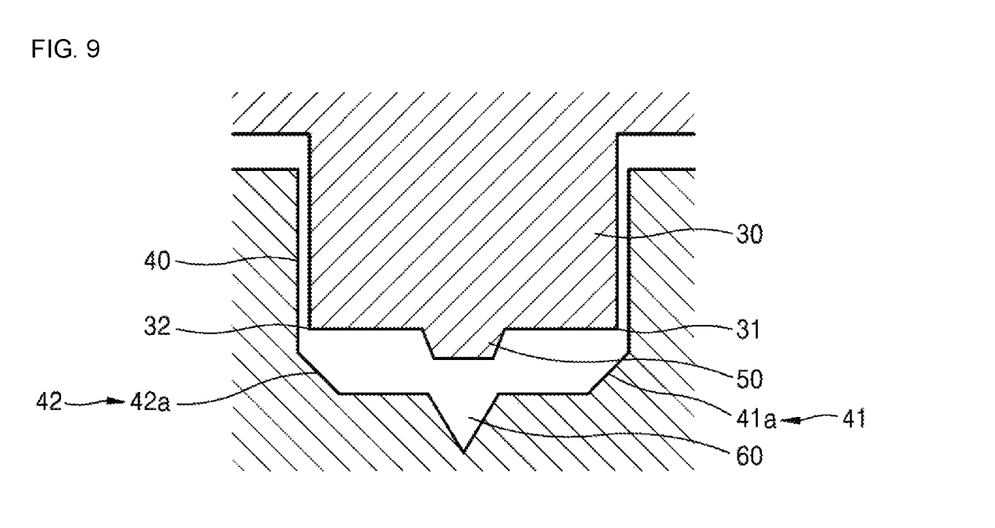
FIGS. 9 to 14 schematically show sectional views of further various embodiments of the fusible protrusion and the fusible protrusion accommodating part of the nozzle for cleaning a substrate of FIG. 1.

Further, as shown in FIG. 9, the nozzle 100 for cleaning a substrate may further include a fusible ridge accommodating part 60 concavely formed along the fusible protrusion accommodating part 40 or the fusible protrusion 30 to accommodate a part of the fusible ridge 50, thereby receiving melt generated when the fusible ridge 50 is melted during ultrasonic welding.

To be more specific, to prevent a void from forming at a certain portion when the melt of the fusible protrusion 30 is not smoothly filled in a space below the fusible protrusion 30 during ultrasonic welding, the fusible ridge accommodating part 60 may be provided in the fusible protrusion accommodating part 40 at the area where the void usually forms corresponding to the fusible ridge 50 of the fusible protrusion 30.

Accordingly, during ultrasonic welding, the fusible ridge 50 is melted by being brought into contact with the bottom surface of the fusible protrusion accommodating part 40 and the fusible protrusion accommodating part 40 before the fusible protrusion 30, whereby it is possible to control the flow of the melt to be filled from the fusible ridge accommodating part 60 formed at the area where the void usually forms. Thereby, the melt of the fusible protrusion 30 and the fusible ridge 50 is induced to be evenly filled to the bonding surface without void formation during ultrasonic welding, and thus, it is possible to make ultrasonic welding even easier and increase bonding force even further. For example, when the first body 10 and the second body 20 are bonded together using an adhesive or by conventional ultrasonic welding, the internal pressure applied to the deionized water passage C by the deionized water can be accommodated up to about 4.5 MPa, but as described above, when the first body 10 and the second body 20 are bonded together by ultrasonic welding in the state where the fusible ridge 50 is formed in the fusible protrusion 30, the ultrasonic welding is done more firmly, so it is possible to accommodate the internal pressure applied to the deionized water passage C by the deionized water up to 10 MPa.

Figure 10:
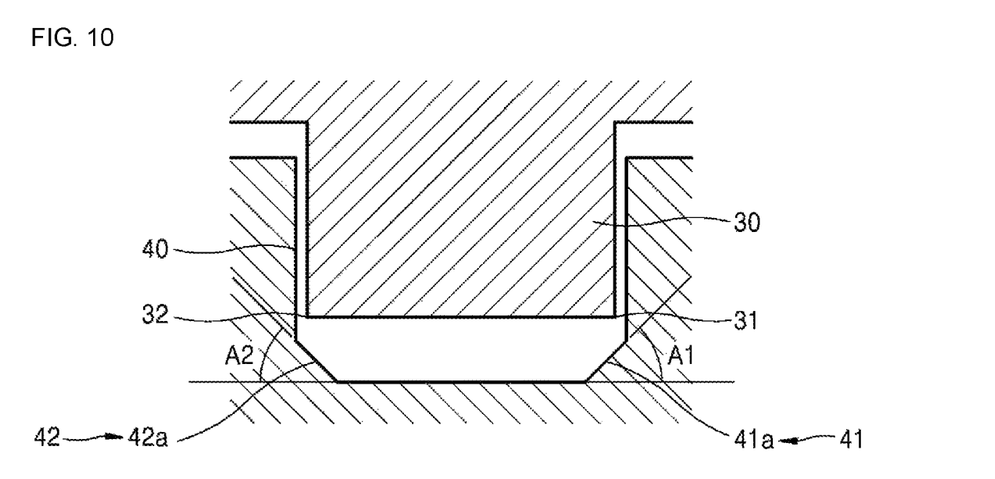

Further, as shown in FIG. 10, the fusible protrusion 30 may be configured such that a first protruding corner 31 is protrudingly formed on an inner diameter side thereof and a second protruding corner 32 is protrudingly formed on an outer diameter side thereof with a quadrangular cross-section, and the fusible protrusion accommodating part 40 may be configured such that a first accommodating corner 41 is concavely formed on an inner diameter side thereof and a second accommodating corner 42 is concavely formed on an outer diameter side thereof with a quadrangular cross-section to correspond the fusible protrusion 30.

To be more specific, the first accommodating corner 41 may be formed with a first inclined portion 41a at a first angle A1 with respect to a bottom surface of the fusible protrusion accommodating part 40 such that the first protruding corner 31 is sequentially brought into contact therewith and is melted during ultrasonic welding, and the second accommodating corner 42 may be formed with a second inclined portion 42a at a second angle A2 with respect to the bottom surface of the fusible protrusion accommodating part 40 such that the second protruding corner 32 is sequentially brought into contact therewith and is melted during ultrasonic welding.

Accordingly, the first angle A1 of the first inclined portion 41a and the second angle A2 of the second inclined portion 42a are formed to be equal to each other, so that during ultrasonic welding, the first protruding corner 31 is brought into contact with the first inclined portion 41a from the end of the corner to be sequentially melted and the second protruding corner 32 is brought into contact with the second inclined portion 42a from the end of the corner to be sequentially melted. Thereby, the flow of the melt is controlled to be sequentially filled from the opposite corners 41 and 42 of the fusible protrusion accommodating part 40 to a space between the fusible protrusion 30 and the fusible protrusion accommodating part 40, so as to induce the void not to form in the space between the fusible protrusion 30 and the fusible protrusion accommodating part 40 during ultrasonic welding, so it is possible to make ultrasonic welding even easier and increase bonding force even further.

Figure 11:
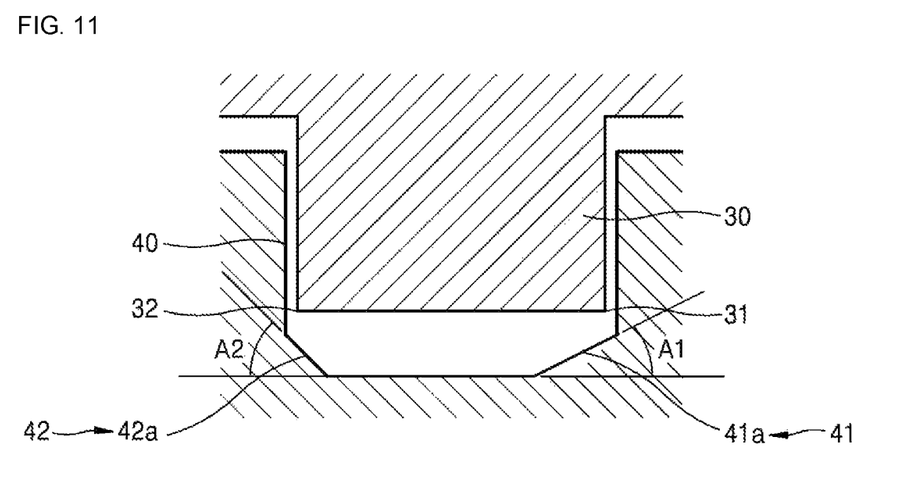

Further, as shown in FIG. 11, the fusible protrusion accommodating part 40 may be configured such that the first angle A1 of the first inclined portion 41a and the second angle A2 of the second inclined portion 42a are different from each other to be asymmetrically melted during ultrasonic welding and to allow the melt to be filled from the first accommodating corner 41 or the second accommodating corner 42.

To be more specific, the first angle A1 of the first inclined portion 41a is formed to be smaller than the second angle A2 of the second inclined portion 42a, so that the second protruding corner 32 can be brought into contact with the second inclined portion 42a before the first protruding corner 31 during ultrasonic welding. Accordingly, during ultrasonic welding, the second protruding corner 32 is induced to be firstly brought into contact with the second inclined portion 41a and be sequentially melted, and then the first protruding corner 31 is induced to be brought into contact with the first inclined portion 41a and be sequentially melted.

Thereby, the flow of the melt is controlled to be sequentially filled from a part of the opposite corners 41 and 42 of the fusible protrusion accommodating part 40 to a space between the fusible protrusion 30 and the fusible protrusion accommodating part 40, so as to induce the void not to form in the space between the fusible protrusion 30 and the fusible protrusion accommodating part 40 during ultrasonic welding, so it is possible to make ultrasonic welding even easier and increase bonding force even further.

Figure 12:
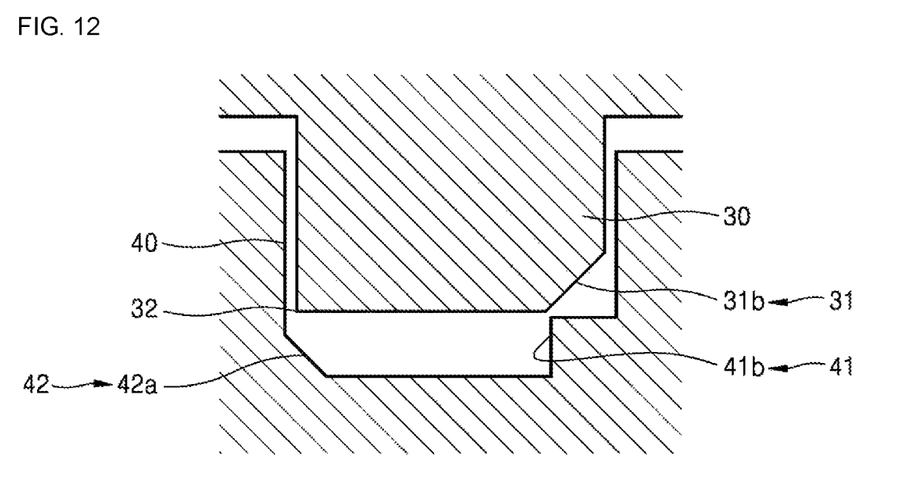

Further, as shown in FIG. 12, the fusible protrusion 30 may be provided with a third inclined portion 31b formed in the first protruding corner 31 or the second protruding corner 32 by being inclined with respect to the protruding surface of the fusible protrusion 30 to be asymmetrically melted during ultrasonic welding and to allow the melt to be filled from the first accommodating corner 41 or the second accommodating corner 42, and the fusible protrusion accommodating part 40 may be protrudingly provided with a quadrangular protruding portion 41b with a quadrangular cross-section in the first protruding corner 31 or the second protruding corner 32, to be sequentially brought into contact with the third inclined portion 31b and be melted.

To be more specific, the first protruding corner 31 is formed with the third inclined portion 31b inclined with respect to the protruding surface and the first accommodating corner 41 is formed with the quadrangular protruding portion 41b, so that the first protruding corner 31 can be brought into contact with the quadrangular protruding portion 41b before the second protruding corner 32 during ultrasonic welding. Accordingly, during ultrasonic welding, the first protruding corner 31 formed with the third inclined portion 31b is induced to be firstly brought into contact with the first accommodating corner 41 formed with the quadrangular protruding portion 41b and be sequentially melted, and then the second protruding corner 32 is induced to be brought into contact with the second inclined portion 42a and be sequentially melted.

Thereby, the flow of the melt is controlled to be sequentially filled from a part of the opposite corners 41 and 42 of the fusible protrusion accommodating part 40 to a space between the fusible protrusion 30 and the fusible protrusion accommodating part 40, so as to induce the void not to form in the space between the fusible protrusion 30 and the fusible protrusion accommodating part 40 during ultrasonic welding, so it is possible to make ultrasonic welding even easier and increase bonding force even further.

Figure 13:
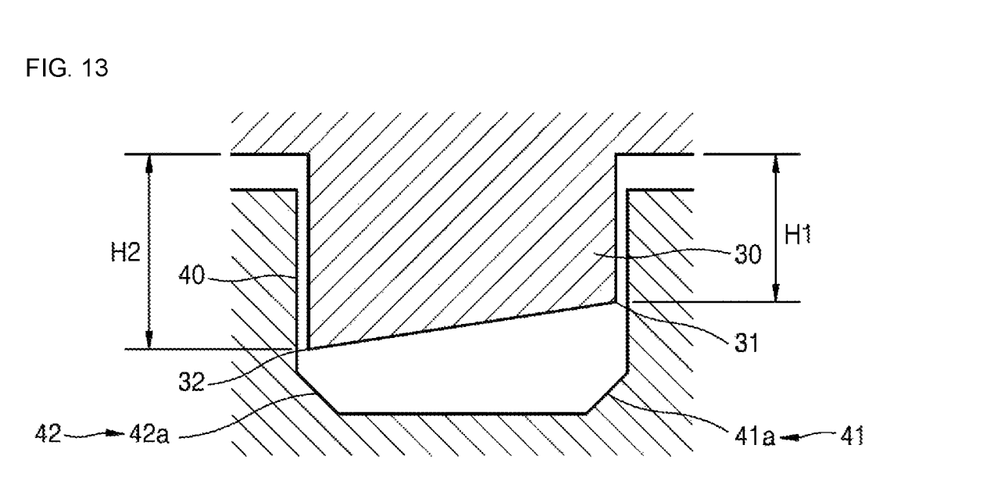

Further, as shown in FIG. 13, the fusible protrusion 30 may be configured such that the first protruding corner 31 is formed to have a first height H1 from a surface of the first body 10, and the second protruding corner 32 is formed to have a second height H2, which is different from the first height H1, from a surface of the first body 10, whereby the protruding surface is formed to be inclined, so as to be asymmetrically melted during ultrasonic welding and to allow the melt to be filled from the first accommodating corner 41 or the second accommodating corner 42.

To be more specific, the first protruding corner 31 having the first height H1 may be formed to be lower than the second protruding corner 32 having the second height, so that the second protruding corner 32 can be brought into contact with the second inclined portion 42a before the first protruding corner 31 during ultrasonic welding. Accordingly, during ultrasonic welding, the second protruding corner 32 having the second height H2 is induced to be firstly brought into contact with the second inclined portion 42a and be sequentially melted, and then the first protruding corner 31 having the second height H2 lower than the first height H1 is induced to be brought into contact with the first inclined portion 41a and be sequentially melted.

Thereby, the flow of the melt is controlled to be sequentially filled from a part of the opposite corners 41 and 42 of the fusible protrusion accommodating part 40 to a space between the fusible protrusion 30 and the fusible protrusion accommodating part 40, so as to induce the void not to form in the space between the fusible protrusion 30 and the fusible protrusion accommodating part 40 during ultrasonic welding, so it is possible to make ultrasonic welding even easier and increase bonding force even further.

Figure 14:
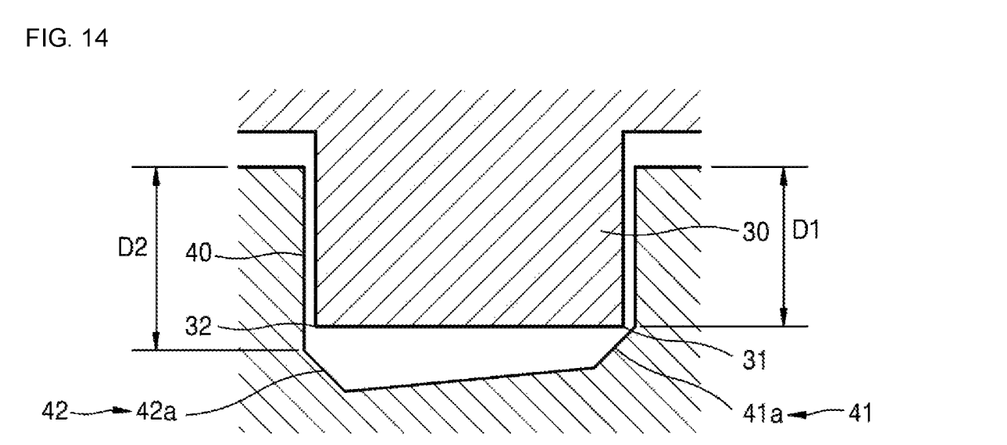

Further, as shown in FIG. 14, the fusible protrusion accommodating part 40 may be configured such that the first accommodating corner 41 is formed to have a first depth D1 from a surface of the second body 20, and the second accommodating corner 42 is formed to have a second depth D2, which is different from the first depth D1, from a surface of the second body 20, whereby the bottom surface is formed to be inclined, so as to be asymmetrically melted during ultrasonic welding and to allow the melt to be filled from the first accommodating corner 41 or the second accommodating corner 42.

To be more specific, the first accommodating corner 41 formed with the first inclined portion 41a may be formed to have the first depth D1 shallower than the second depth D2 of the second accommodating corner 42 formed with the second inclined portion 42a, so that the first protruding corner 31 can be brought into contact with the first inclined portion 41a before the second protruding corner 32 during ultrasonic welding. Accordingly, during ultrasonic welding, the first protruding corner 31 is induced to be firstly brought into contact with the first inclined portion 41a and be sequentially melted, and then the second protruding corner 32 is induced to be brought into contact with the second inclined portion 42a and be sequentially melted.

Thereby, the flow of the melt is controlled to be sequentially filled from a part of the opposite corners 41 and 42 of the fusible protrusion accommodating part 40 to a space between the fusible protrusion 30 and the fusible protrusion accommodating part 40, so as to induce the void not to form in the space between the fusible protrusion 30 and the fusible protrusion accommodating part 40 during ultrasonic welding, so it is possible to make ultrasonic welding even easier and increase bonding force even further.

According to the nozzle 100 for cleaning a substrate according to various embodiments of the present invention, when the nozzle 100 for cleaning a substrate is separately formed into the first body 10 and the second body 20, each of the bodies 10 and 20 is formed of a resin material of engineering plastics having high strength used as an industrial material and a structural material, whereby it is possible to easily form complex and various shapes of deionized water passage C by machining or injection molding. Further, without using bonding by a third material such as an adhesive or using physical fastening by a screw, by using the resin material, it is possible to couple the first body 10 and the second body 20 together simply and firmly by ultrasonic welding.

Accordingly, deionized water can easily be accommodated in the nozzle by forming complex and various shapes of deionized water passage C in the bodies 10 and 20 having high strength, and thereby, when the ultrasonic vibration is generated by a vibrator provided in the first body 10, deionized water in the deionized water passage C is sprayed onto the substrate in the form of fine droplets through the spray holes 21 of the second body 20 to effectively clean the substrate while minimizing damage to the micropattern thereof.

Further, during ultrasonic welding, using various shapes of the fusible protrusion 30 and the fusible protrusion accommodating part 40, without using a third material such as an adhesive, the first body 10 and the second body 20 of resin material are firmly coupled together only by a simple process, and due to the uniform fusion of the welded area, the first body 10 and the second body 20 have an adhesion rate of 98% or more and can exhibit uniform strength at high pressure, whereby the manufacturing cost of the nozzle 100 for cleaning a substrate is reduced and the strength of the bodies 10 and 20 is increased, so as to effectively clean the substrate having a micropattern in various pressure ranges.

As described above, although the exemplary embodiments of the present invention have been disclosed, those skilled in the art will appreciate that various modifications or changes are possible, without departing from the scope and spirit of the invention as disclosed in the accompanying claims.

What is claimed is:

1. A nozzle for cleaning a substrate, the nozzle comprising:
   a first body including a first part of a cleaning liquid passage provided in a first surface of the first body, and a cleaning liquid supply hole formed in the first body from a second surface of the first body to the cleaning liquid passage so as to supply a cleaning liquid to the cleaning liquid passage;
   a second body including a second part of the cleaning liquid passage provided in a third surface of the second body, wherein the third surface is coupled to the first body, and a plurality of spray holes formed in the second body from the cleaning liquid passage to a cleaning liquid spray surface along the cleaning liquid passage so as to spray the cleaning liquid to a substrate;

a fusible protrusion protruding from one of the first surface of the first body and the third surface of the second body; and a fusible protrusion accommodating part protruding from the other of the first surface of the first body and the third surface of the second body to accommodate the fusible protrusion, wherein the fusible protrusion includes a first fusible step provided in the cleaning liquid passage in an entirely circular shape or a partial arc shape having a first diameter along the cleaning liquid passage based on a central axis of the first body or the second body, wherein the fusible protrusion accommodating part includes a first fusible linear groove part provided in the cleaning liquid passage along the cleaning liquid passage in a shape corresponding to the first fusible step to accommodate the first fusible step, wherein the first fusible step is fused with the first fusible linear groove part during ultrasonic welding, so as to couple the first body and the second body, and wherein the fused first fusible step and first fusible linear groove part are surrounded by the cleaning liquid passage.

2. The nozzle of claim 1, wherein the fusible protrusion further includes:
a second fusible step formed in an entirely circular shape or a partial arc shape having a second diameter larger than the first diameter to surround the first fusible step, and wherein the fusible protrusion accommodating part further includes:
a second fusible linear groove part formed in the first body or the second body along the cleaning liquid passage in a shape corresponding to the second fusible step to accommodate the second fusible step.

3. The nozzle of claim 1, further comprising:
a fusible ridge provided protruding along the fusible protrusion or the fusible protrusion accommodating part and fused during ultrasonic welding by being brought into contact with a bottom surface of the fusible protrusion accommodating part or a protruding surface of the fusible protrusion.

4. The nozzle of claim 3, further comprising:
a fusible ridge accommodating part concavely formed along the fusible protrusion accommodating part or the fusible protrusion to accommodate a part of the fusible ridge, thereby receiving melt generated when the fusible ridge is melted during ultrasonic welding.

5. The nozzle of claim 3, wherein the fusible ridge is formed in a wave form along the fusible protrusion or the fusible protrusion accommodating part.

6. The nozzle of claim 1, wherein the fusible protrusion is configured such that a first protruding corner is protrudingly formed on an inner diameter side thereof and a second protruding corner is protrudingly formed on an outer diameter side thereof with a quadrangular cross-section, and the fusible protrusion accommodating part is configured such that a first accommodating corner is concavely formed on an inner diameter side thereof and a second accommodating corner is concavely formed on an outer diameter side thereof with a quadrangular cross-section to correspond the fusible protrusion.

7. The nozzle of claim 6, wherein the first accommodating corner is formed with a first inclined portion inclined at a first angle with respect to a bottom surface of the fusible protrusion accommodating part such that the first protruding corner is sequentially brought into contact therewith and is melted during ultrasonic welding, and the second accommodating corner is formed with a second inclined portion inclined at a second angle with respect to the bottom surface of the fusible protrusion accommodating part such that the second protruding corner is sequentially brought into contact therewith and is melted during ultrasonic welding.

8. The nozzle of claim 7, wherein the fusible protrusion accommodating part is configured such that the first angle of the first inclined portion and the second angle of the second inclined portion are different from each other to be asymmetrically melted during ultrasonic welding and to allow the melt to be filled from the first accommodating corner or the second accommodating corner.

9. The nozzle of claim 1, wherein each of the first body and the second body is made of a resin material, and the resin material is engineering plastics of a material selected from the group consisting of PEEK, POK, PPS, PCTFE, and PFA FA.

10. The nozzle of claim 1, wherein the cleaning liquid is deionized water that flows through the cleaning liquid passage for cleaning the substrate.

11. The nozzle of claim 2, wherein the fusible protrusion further includes a third fusible step having a third diameter smaller than the first diameter of the first fusible step, and the fusible protrusion accommodating part further includes a third fusible linear groove part formed in a shape corresponding to the third fusible step to accommodate the third fusible step, wherein the second fusible step is fused with the second fusible linear groove part and the third fusible step is fused with the third fusible linear groove part during the ultrasonic welding, and wherein an inner portion of the cleaning liquid passage abuts the fused first linear groove part and the fused third linear groove part, and an outer portion of the cleaning liquid passage abuts the fused first linear groove part and the fused second linear groove part.

* * * * *